Sept. 21, 1965 R. GALLETTI 3,207,920

TUNNEL DIODE LOGIC CIRCUIT

Filed July 28, 1961

INVENTOR
REMO GALLETTI

BY Kenyon & Kenyon

ATTORNEYS 3,207,920
Patented Sept. 21, 1965

3,207,920
TUNNEL DIODE LOGIC CIRCUIT

Remo Galletti, Milan, Italy, assignor to Ing. C. Olivetti & C., S.p.A., Ivrea, Italy, a corporation of Italy
Filed July 28, 1961, Ser. No. 127,537
Claims priority, application Italy, July 29, 1960, 13,599/60
7 Claims. (Cl. 307—88.5)

The present invention relates to logic circuits using tunnel diodes.

In the electronic data processing and computing field logic circuits are known, which use tunnel diodes as bistable elements. More particularly, a known logic circuit comprises a tunnel diode having first and second voltage states, which diode is simultaneously fed with an excitation current and with a control current responsive to input signals, said diode being switched or not from said first state to said second state depending upon whether said control current is higher or not than a predetermined value.

It is also known that an inverter circuit may be obtained by connecting the series combination of a tunnel diode and a resistor across a constant voltage source.

By suitably combining an "or" gate with such an inverter circuit, a "nor" circuit is obtained, which is useful in that whatever logic function may be performed by properly interconnecting a plurality of like "nor" circuits.

However, a disadvantage of such a "nor" circuit resides in that it cannot be directly driven by the output of a preceding similar circuit.

The object of the invention is to obviate such a disadvantage and to provide a logic circuit of high reliability and simple structure.

The logic circuit according to the invention comprises an output tunnel diode having first and second voltage states, which diode is simultaneously fed with an excitation current and with a control current responsive to input signals, said diode being switched or not from said first state to said second state depending upon whether said control current is higher or not than a predetermined value, and is characterized in that said control current is fed to said output tunnel diode through an input tunnel diode adapted to be switched from a first to a second voltage state in response to said input signals for controlling the value of said control current.

The novel features of the invention will become apparent from the following description of a preferred embodiment thereof, taken in conjunction with the accompanying drawing, in which.

Figure 2:
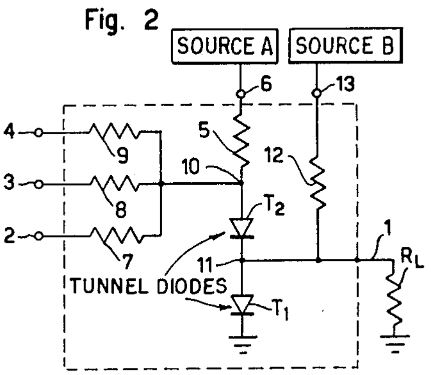
FIG. 2 shows an embodiment of the circuit according to the invention.
Figure 3:
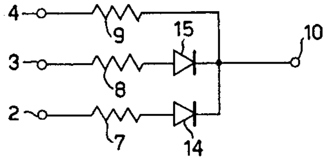
Figure 4:
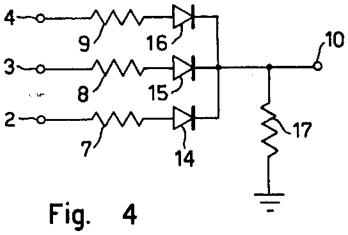
Figure 5:
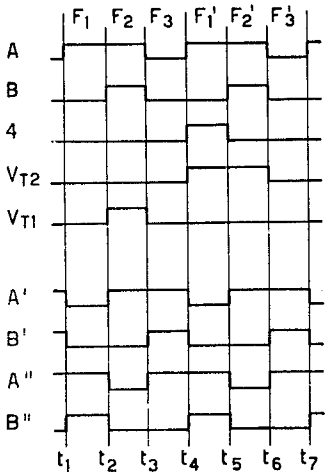
Figure 6:
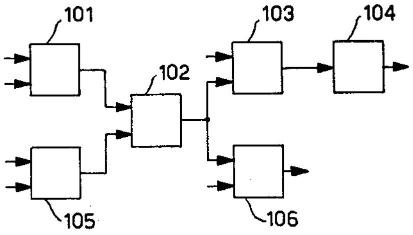

FIGS. 3 and 4 partially show other embodiments of the invention;

FIG. 5 shows the time diagram of some signals appearing in the circuit of FIG. 2;

FIG. 6 shows a logic network comprising a plurality of logic circuits according to the invention.

Figure 1:
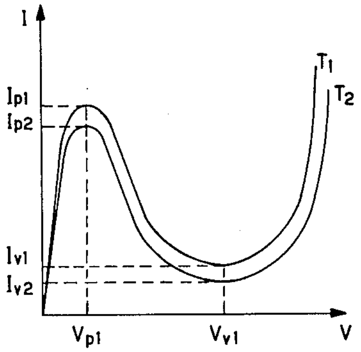
FIG. 1 shows the voltage-current characteristics of a pair of tunnel diodes used in the circuit according to the invention.

The voltage-current characteristics of a tunnel diode $T_1$ or $T_2$ (FIG. 1) exhibits, in the direction of increasing voltages V, a first region having a positive resistance, a second region having a negative resistance and a third region having a positive resistance, the coordinates of the point common to the first and the second region being the peak current $I_p$ and the peak voltage $V_p$ and the coordinates of the point common to the second and the third region being the valley current $I_v$ and the valley voltage $V_v$.

The logical circuit according to the invention comprises (FIG. 2) an output tunnel diode $T_1$ which may be switched from a low voltage state to a high voltage state to provide on an output terminal 1 corresponding output signals upon the concurrent application of an excitation current from an excitation current source B and of a control current from an input tunnel diode $T_2$, the diode $T_1$ being switched or not by said currents depending upon whether said control current is higher or not than a predetermined value.

Said input diode $T_2$ is connected between a supply current source A and the diode $T_1$ and is arranged to be switched from a low voltage state to a high voltage state to selectively apply high or low control current from said supply current source through the diode $T_1$ in response to input signals received on input terminals 2, 3, 4, said high and low control current being higher, respectively lower, than said predetermined value.

More particularly, the diode $T_2$ is connected in series with a resistance 5, whose terminal 6 is connected to the current source A which is adapted to supply recurrent pulses having a constant amplitude. The input terminals 2, 3 and 4, three in the present embodiment, are individually connected through a suitable impedance, e.g., a resistance 7, 8 and 9, respectively, to the junction point 10 between the diode $T_2$ and the resistance 5, in order to selectively produce through the diodes $T_1$ and $T_2$ a current cooperating with the current from the source A for switching the diode $T_2$ without switching the diode $T_1$. The junction point 11 between the diodes $T_1$ and $T_2$ is connected to a resistance 12, whose terminal 13 is connected to the excitation current source B which is adapted to produce recurrent pulses having a constant amplitude. Moreover, the junction point 11 is directly connected to the output terminal 1, which is connected to a load represented by a resistance $R_L$.

The logical binary state 0 of the input and output signals is represented by a voltage level substantially not exceeding the peak voltage $V_{p1}$ of the diode $T_1$, and the logical binary state 1 is represented by a voltage level substantially not lower than its valley voltage $V_{v1}$. Furthermore, the diodes $T_1$ and $T_2$ are said to be in their 0 or low voltage state when their voltage $V_{T1}$ and $V_{T2}$ respectively, does not substantially exceed their respective peak voltage, and to be in their 1 or high voltage state when their voltage is substantially not lower than their respective valley voltage. The peak current $I_{p2}$ of the diode $T_2$ is lower than the peak current $I_{p1}$ of the diode $T_1$.

A suitable synchronizing apparatus, e.g., a counter, controls the cyclic operation of the logic circuit, each cycle comprising three phases $F_1$, $F_2$ and $F_3$. In each cycle (FIG. 5) the terminal 6 is held to a potential $+V_A$ during the first and second phase and to a potential 0 during the third phase; the terminal 13 is held to a potential $+V_B$ during the second phase and to a potential 0 during the first and third phase.

The input signals are applied to the terminals 2, 3 and 4 only during the first phase, and the output signal is obtained at the terminal 1 only during the second phase.

Before the time $t_1$ (FIG. 5), the voltage at the terminals 6 and 13 is 0, and the input terminals are at the 0 voltage level, whereby the voltage of the diodes $T_1$ and $T_2$ is also 0. At time $t_1$, when the first phase begins, the voltage $V_A$ is applied to the terminal 6, whereby a current $I_A$ slightly lower than the peak current $I_{p2}$ of the diode $T_2$ flows through the diodes $T_1$ and $T_2$; therefore, the diodes $T_1$ and $T_2$ remain in their 0 state.

Assuming now that the input signals are at the 0 or low voltage level, then both tunnel diodes remain in their 0 state during the first phase.

At the time $t_2$, when the second phase begins, the voltage $V_B$ is applied to the terminal 13, whereby an excitation current pulse flows through the resistance 12 and the diode $T_1$, where it is added to the control current simultaneously supplied by the source A through the diode $T_2$.

The amplitude of said excitation current pulse is such that the resultant current flowing through the diode $T_1$ overcomes its peak current $I_{p1}$; therefore, the diode $T_1$ switches to its state 1, where it remains until the time $t_3$, when the third phase begins.

Therefore, during the second phase an output signal having the level 1 is obtained on the output terminal 1.

During the third phase $F_3$ the voltages applied to the terminals 6 and 13 are removed, whereby the diode $T_1$ is reset back to the 0 state. The diode $T_2$ remains in the 0 state during the entire cycle.

It is thus apparent that during the phase $F_3$ the supply current source A and the excitation current source B act as means for resetting the tunnel diodes $T_1$ and $T_2$, said sources being arranged to ground the terminals 6 and 13 during said phase.

During the first phase $F_1'$ of the following cycle, the voltage $V_A$ at terminal 6 is re-established, whereby the current $I_A$ which is slightly lower than the peak current $I_{p2}$ of the diode $T_2$ flows through the resistance 5.

Assuming one of the input signals, e.g., the signal applied to the terminal 4, is at the 1 or high voltage level, then a current flows from the terminal 4 through the resistance 9 and through the diodes $T_1$ and $T_2$: by properly fixing the value of the resistance 9, the resultant current equal to the sum of said current and of the current $I_A$ flowing through the diodes may be caused to overcome the peak current $I_{P2}$ of the diode $T_2$, so as to switch it to its 1 state, without overcoming the peak current $I_{p1}$ of the diode $T_1$, which, therefore, will remain in its 0 state.

If during the first phase more than one input signal has a positive level 1, the diode $T_2$ would be switched to the state 1 in the same manner.

As a consequence of the diode $T_2$ being switched from the state 0 to the state 1, the potential of the point 10 increases.

Therefore, when the input signals return to the 0 level, the resistances 7, 8 and 9 draw off a part of the current $I_A$ flowing through the resistance 5, whereby the control current flowing through the diodes $T_2$ and $T_1$ diminishes. More particularly, during the second phase $F_2'$ said control current is lower than the control current supplied to the diode $T_1$ during the second phase $F_2$ of the preceding cycle, whereby during the phase $F_2'$ the excitation current pulse produced by the voltage $V_B$ applied to the terminal 13 plus said low control current apply a resultant current through the diode $T_1$ which is not sufficient to switch it. Therefore, the diode $T_1$ remains in its 0 state, thus producing a zero level output signal.

During the third phase $F_3'$ the voltages applied to the terminals 6 and 13 are momentarily removed, whereby the diode $T_2$ is reset to its state 0. The diode $T_1$ remains in its state 0 during the entire cycle.

Summarizing, during the first phase the diode $T_2$ switches or not from the state 0 to the state 1 depending upon whether at least one input signal has the high voltage or 1 level or not. During the second phase a high or a low control current is applied from the source A to the diode $T_1$ depending upon whether the diode $T_2$ is in the state 0 or in the state 1. Furthermore, the excitation current applied during the second phase is sufficient to switch the diode $T_1$ from the state 0 to the state 1 or not depending upon whether a high or a low control current is concurrently applied. Therefore, if during the first phase at least one input signal has the level 1, the output signal obtained during the second phase has the level 0; if all the input signals have the level 0, the output signal has the level 1. Therefore, the logical "nor" function is obtained.

Other logical functions may be obtained by arranging the diode $T_2$ in such a way as to cause it to be switched only in response to the presence of a predetermined combination of input signals.

As previously remarked, if during the first phase the diode $T_2$ has been switched to the state 1, at the end of said phase, when the input signals return to zero level, a part of the current $I_A$ flowing through the resistance 5 is drawn off by the resistances 7, 8 and 9. The resultant reduction of the control current flowing through the diode $T_1$ is necessary in order to inhibit it from switching upon receiving the excitation current pulse during the second phase.

However, the current flowing through the diodes $T_1$ and $T_2$ should not fall in this case under the valley current, in order to avoid undue resetting of the diodes. Such a current fall could appear in a circuit having a great number of input terminals: in such a case it may be avoided, according to the embodiment shown in FIG. 3, by connecting diodes 14, 15 in series with the resistance 7 and 8, provided at least one resistance 9 remains without such a diode; or, according to the embodiment shown in FIG. 4, by connecting diodes 14, 15 and 16 in series with all the input resistances 7, 8 and 9, provided the point 10 is grounded through a suitable resistance 17.

It will thus be apparent that in the described logic circuit each input terminal 2, 3, 4 may be directly connected to the output terminal of a preceding circuit and that the output terminal 1 may be directly connected to an input terminal of one or more following circuits. Therefore, logic networks consisting of a plurality of like logic circuits may be built up.

As in the described logic circuit the output signal is is obtained during the phase which follows the phase during which the input signals are applied, the cycle of each logic circuit must be delayed one phase with respect to the cycle of the preceding circuit.

In the network according to the embodiment of FIG. 6, which comprises six logic circuits 101, 102, 103, 104, 105 and 106, each one having the structure and mode of operation of the logic circuit previously disclosed in connection with FIGS. 2, 3 or 4, the second phase of a cycle of the circuits 101 and 105, the first phase of said cycle of the circuit 102, the third phase of the next preceding cycle of the circuits 103 and 106, and the second phase of said preceding cycle of the circuit 104 are simultaneous. Therefore, if the pulses supplied by the sources A and B to the circuits 101, 104 and 105 are as shown with the reference letters A and B in FIG. 5, the same pulses for the circuit 102 will be as shown with the reference letters A' and B', and for the circuit 103 and 106 as shown with the reference letters A" and B".

From the foregoing description it will be understood that many changes may be made in the above circuit, and different embodiments of the invention could be made without departing from the scope thereof. It is, therefore, intended that all matter contained in the above description and shown in the accompanying drawings shall be interpreted as illustrative and not in a limiting sense.

What I claim is:

1. A logic circuit comprising a first tunnel diode and a second tunnel diode, each having high and low voltage states, the peak current rating of said second tunnel diode being rated higher than the peak current rating of said second tunnel diode, said first and second tunnel diodes being connected in series with a control current source, input means comprising impedance means connecting an input to the junction point between said source and said second tunnel diode for controlling the current passing through said second tunnel diode and thereby controlling the voltage state of said second diode, and excitation current means connected at the junction between said first and second diodes, said excitation current and said control current combining to control the voltage state of said first tunnel diode.

2. A logic circuit comprising an output tunnel diode having low and high voltage states, means for applying an excitation current to said output tunnel diode, means for simultaneously applying a control current to said output tunnel diode, said output tunnel diode being switched from said low to said high voltage state upon said control current being higher than a predetermined value, said control current applying means comprising a current source and an input tunnel diode having low and high voltage states and having a rated peak current lower than the rated peak current of said output tunnel diode, said source being connected to said output tunnel diode through said input tunnel diode, an input circuit connected to said input tunnel diode at the junction point between said source and said input tunnel diode and means responsive to an input signal applied to said input circuit for selectively producing through said tunnel diodes a current cooperating with the current from said source for overcoming the peak current of said input tunnel diode without overcoming the peak current of said output tunnel diode, whereby said input tunnel diode switches from its low voltage state to its high voltage state to determine a value of the control current applied from said source to said output tunnel diode which is lower than said predetermined value.

3. A logic circuit comprising an output tunnel diode having low and high voltage states, means for applying an excitation current to said output tunnel diode, means for simultaneously applying a control current to said output tunnel diode, said output tunnel diode being switched from said low voltage state to said high voltage state upon said control current being higher than a predetermined value, said control current applying means comprising a control current source and an input tunnel diode having low and high voltage states and having a rated peak current lower than the rated peak current of said output tunnel diodes, said control current source being connected to said output tunnel diode through said input tunnel diode, a plurality of input terminals, impedance means connecting said input terminals to the junction point between said source and said input tunnel diode, means for applying input signals on said input terminals to selectively produce through said tunnel diodes a current cooperating with the current from said source for overcoming the peak current of said input tunnel diode without overcoming the peak current of said output tunnel diode to thereby control the state of said input tunnel diode and to determine a value of the control current applied from said control current source to said output tunnel diode.

4. A logic "nor" circuit comprising an output tunnel diode having low and high voltage states, a current source, an input tunnel diode having low and high voltage states, said source being connected to said output tunnel diode through said input tunnel diode, means for resetting said tunnel diodes to said low voltage state, a plurality of input terminals connected to said input tunnel diode at the junction point between said current source and said input tunnel diode for receiving input signals, said input tunnel diode being responsive to at least one point signal having a high voltage level for switching said input tunnel diode to said high voltage state, whereby a low control current is applied from said source through said output tunnel diode, and means for applying an excitation current through said output tunnel diode at the junction between said input and output tunnel diodes, said excitation current being insufficient when combined with said control current to switch said output tunnel diode from said low to said high voltage state when said input tunnel diode is in said high voltage state and sufficient when combined with said control current to switch said output tunnel diode from said low to said high voltage state when said input tunnel diode is in said low voltage state.

5. A logic "nor" circuit comprising an output tunnel diode having low and high voltage states, a current source, an input tunnel diode having low and high voltage states and having a rated peak current lower than the rated peak current of said output tunnel diode, said current source being connected to said output tunnel diode through said input tunnel diode, means for resetting said tunnel diodes to said low voltage state, a plurality of input terminals, impedance means connecting said input terminals to the junction point between said source and said input tunnel diode, means for applying input signals to said input terminals to produce through said tunnel diodes, in response to at least one input signal having a high voltage level, a current cooperating with a current from said source for overcoming the peak current of said input tunnel diode without overcoming the peak current of said output tunnel diode, whereby a low control current is applied from said source through said output tunnel diode, and means for applying an excitation current through said output tunnel diode at the junction between said input and output tunnel diodes, said excitation current being insufficient when combined with said control current to switch said output tunnel diode from said low to said high voltage state when said input tunnel diode is in said high voltage state and sufficient when combined with said control current to switch said output tunnel diode from said low to said high voltage state when said input tunnel diode is in said low voltage state.

6. A logic circuit comprising an output tunnel diode having low and high voltage states, a current source, an input tunnel diode having low and high voltage states and having a rated peak current lower than the rated peak current of said output diode, said source being connected to said output tunnel diode through said input tunnel diode, a plurality of input terminals connected to the common junction between said current source and said input tunnel diode, means for applying input signals to said input terminals to selectively produce through said tunnel diodes a current cooperating with the current from said source for overcoming the peak current of said input tunnel diode to control the state of said input tunnel diode for selectively applying a control current from said source through said output tunnel diode, and means for applying an excitation current to said output tunnel diode at a connecting point intermediate said input and output tunnel diodes to permit said control current and said excitation current to simultaneously pass through and control the state of said output tunnel diode.

7. A circuit comprising an input tunnel diode, an output tunnel diode having low and high voltage states and having a rated peak current lower than the rated peak current of said output tunnel diode, a current source connected to said output tunnel diode through said input tunnel diode, and means connected to the junction between said input tunnel diode and said current source for selectively producing through said tunnel diodes a current overcoming the peak current of said input tunnel diode without overcoming the peak current of said output tunnel diode in order to control the state of said input tunnel diode and means connected between the junction of said diodes and the other extremity of said output diode for determining the state of said output tunnel diode.

References Cited by the Examiner

UNITED STATES PATENTS

| | | | |
|---|---|---|---|
| 3,040,190 | 6/62 | Buelow | 307—88.5 |
| 3,094,631 | 6/63 | Davis | 307—88.5 |

OTHER REFERENCES

Proceedings of the Eastern Joint Computer Conference, Dec. 3, 1959; (page 43 relied on), copy in Group 240.

Mayeda: I.B.M. Technical Disclosure Bulletin, vol. 3, No. 10, March 1961, (pp.74 to 76), (pp. 74 and 76 relied on).

Richards: Digital Computer Components and Circuits, Van Nostrand, 1957; (page 54 relied on).

ARTHUR GAUSS, *Primary Examiner.*

JOHN W. HUCKERT, *Examiner.*